United States Patent
Gao et al.

(10) Patent No.: US 10,454,278 B2
(45) Date of Patent: Oct. 22, 2019

(54) INDEPENDENT SPEED VARIABLE FREQUENCY BASED ELECTRIFIED PROPULSION SYSTEM ARCHITECTURE

(71) Applicant: The Boeing Company, Chicago, IL (US)

(72) Inventors: Lijun Gao, Renton, WA (US); Shengyi Liu, Sammamish, WA (US)

(73) Assignee: THE BOEING COMPANY, Chicago, IL (US)

( * ) Notice: Subject to any disclaimer, the term of this patent is extended or adjusted under 35 U.S.C. 154(b) by 137 days.

(21) Appl. No.: 15/866,064

(22) Filed: Jan. 9, 2018

(65) Prior Publication Data
US 2019/0214828 A1 Jul. 11, 2019

(51) Int. Cl.
| | |
|---|---|
| H02J 3/46 | (2006.01) |
| H02P 9/42 | (2006.01) |
| B60L 50/13 | (2019.01) |
| G01R 31/00 | (2006.01) |
| G01R 31/08 | (2006.01) |
| H02J 9/08 | (2006.01) |
| H02P 5/46 | (2006.01) |

(52) U.S. Cl.
CPC ............. *H02J 3/46* (2013.01); *B60L 50/13* (2019.02); *G01R 31/008* (2013.01); *G01R 31/086* (2013.01); *H02J 9/08* (2013.01); *H02P 5/46* (2013.01); *H02P 9/42* (2013.01)

(58) Field of Classification Search
CPC .... H02J 3/46; H02J 9/08; B60L 50/13; G01R 31/008; G01R 31/0086; H02P 5/46; H02P 9/42
See application file for complete search history.

(56) References Cited

U.S. PATENT DOCUMENTS

| | | | |
|---|---|---|---|
| 2,896,143 | A | 7/1959 | Andrew |
| 4,625,160 | A | 11/1986 | Hucker |
| 4,772,802 | A | 9/1988 | Glennon et al. |
| 4,868,406 | A | 9/1989 | Glennon et al. |
| 5,036,267 | A | 7/1991 | Markunas et al. |
| 5,068,590 | A | 11/1991 | Glennon et al. |
| 5,581,168 | A | 12/1996 | Rozman et al. |
| 6,462,429 | B1 | 10/2002 | Dhyanchand et al. |

(Continued)

OTHER PUBLICATIONS

European Patent Office; Extended European Search Report; European Patent Application No. 18210648.4 dated May 29, 2019.

(Continued)

*Primary Examiner* — Robert L Deberadinis
(74) *Attorney, Agent, or Firm* — Parsons Behle & Latimer (57) ABSTRACT

An alternating current (AC) power distribution system may include an independent speed variable frequency (ISVF) generator configured to generate an AC power signal having a frequency that is independent from a frequency of a prime mover. The system may also include at least one AC load configured to receive the AC power signal without performing a full-distribution-power-rated power conversion. In another embodiment, an AC power distribution system includes a generator configured to generate an AC power signal and an AC motor configured to receive the AC power signal without performing a full-distribution-power-rated power conversion, where the AC motor is configured to rotate at a rotational frequency that is independent from a frequency of the AC power signal.

24 Claims, 5 Drawing Sheets

(56) References Cited

U.S. PATENT DOCUMENTS

| | | |
|---|---|---|
| 8,593,095 B2 | 11/2013 | Markunas et al. |
| 2004/0113592 A1 | 6/2004 | Adams |
| 2010/0308582 A1 | 12/2010 | Rozman et al. |
| 2012/0211981 A1 | 8/2012 | De Wergifosse |
| 2013/0172148 A1 | 7/2013 | Wiencek et al. |
| 2014/0265744 A1 | 9/2014 | Rozman |
| 2015/0244303 A1 | 8/2015 | Gao et al. |

OTHER PUBLICATIONS

K. M. Chirgwin et al: "Variable Speed Constant Frequency Generator System for Aircraft", IEEE Journals & Magzine, Nov. 30, 1959 (Nov. 30, 1959), pp. 304-310, XP055589918.

US Patent and Trademark Office; Office Action; U.S. Appl. No. 15/819,919; dated Nov. 6, 2018.

European Patent Office; Extended European Search Report; European Patent Application No. 18202257.4 dated Apr. 23, 2019.

INDEPENDENT SPEED VARIABLE FREQUENCY BASED ELECTRIFIED PROPULSION SYSTEM ARCHITECTURE

FIELD OF THE DISCLOSURE

This disclosure is generally related to the field of alternating current (AC) power distribution and, in particular, independent speed variable frequency (ISVF) based electrified propulsion systems.

BACKGROUND

Commercial vehicles, in particular aircraft, typically include complex propulsion systems to generate sufficient thrust for operation. In typical aircraft, AC generators may be coupled to an engine in order to generate an AC power signal on an AC bus. However, the AC power signal typically does not meet a frequency requirement of an AC motor configured to drive a propulsion system (e.g., a propeller, etc.). The AC power signal may be rectified in order to generate a direct current (DC) power signal on a DC bus. Individual motor controllers may then convert the DC power signal into an AC power signal that meets a frequency requirement of the AC motor.

The equipment used to rectify the AC power signal created by the generators may include an automatic transfer rectifier unit or another type of rectifier. This equipment may add significant weight to an aircraft. Further, rectification of an AC power signal inherently results in some power loss. Likewise, the motor controllers used to control the AC motors may add weight and result in significant power loss as they convert, typically through the use of an inverter, the DC power signal into the AC power signal used to drive the AC motor. Other disadvantages may exist.

SUMMARY

Disclosed are systems and methods that may overcome at least one of the above-identified disadvantages. For example, an AC power distribution system may avoid a full-distribution-power-rated power conversion, as defined herein, when operating an AC motor propulsion system. In some embodiments, the system may include an ISVF generator, as described herein, to cause a frequency of an AC power signal on an AC bus to be within a frequency requirement of the AC motor propulsion system. In some embodiments, the system may include a variable speed independent frequency (VSIF) motor, as described herein, to enable the AC motors to operate at rotational frequencies that are independent of the AC power signal on the AC bus.

In an embodiment, an AC power distribution system includes an ISVF generator configured to generate an AC power signal having a frequency that is independent from a frequency of a prime mover. The system further includes an AC bus configured to receive the AC power signal from the ISVF generator. The system also includes at least one AC load configured to receive the AC power signal from the AC bus without performing a full-distribution-power-rated power conversion, where the frequency of the AC power signal generated by the ISVF generator meets a frequency requirement of the AC load.

In some embodiments, the AC load is an AC motor and the frequency requirement of the AC load corresponds to a rotational frequency requirement of the AC motor. In some embodiments, the motor is incorporated into an aircraft propulsion system. In some embodiments, the system includes a generator control unit configured to control a frequency of the AC power signal generated by the ISVF generator to meet the frequency requirement of the AC load. In some embodiments, the system includes at least one additional AC load configured to receive the AC power signal from the AC bus. In some embodiments, the the at least one additional AC load has the same frequency requirement as the AC load. In some embodiments, the system includes a second ISVF generator configured to generate a second AC power signal having a frequency that is independent from a frequency of the prime mover, a second AC bus configured to receive the AC power signal from the second ISVF generator, and a second AC load configured to receive the second AC power signal from the second AC bus without performing a full-distribution-power-rated power conversion, where the frequency of the second AC power signal generated by the second ISVF generator meets a frequency requirement of the second AC load. In some embodiments, the prime mover is a vehicle engine.

In an embodiment, an alternating current (AC) power distribution system includes a generator configured to generate an AC power signal. The system further includes an AC bus configured to receive an AC power signal from the generator. The system also includes an AC motor configured to receive the AC power signal from the AC bus without performing a full-distribution-power-rated power conversion, where the AC motor is configured to rotate at a rotational frequency that is independent from a frequency of the AC power signal. The system includes a motor control unit configured to receive the AC power signal from the AC bus, to perform a partial power conversion of the AC power signal to generate a converted power signal and to provide the converted power signal to the AC motor, thereby controlling the rotational frequency of the AC motor.

In some embodiments, the AC motor is incorporated into an aircraft propulsion system. In some embodiments, the generator is an ISVF generator, a variable speed variable frequency (VSVF) generator, or a constant speed constant frequency (CSCF) generator. In some embodiments, the system includes at least one additional AC motor configured to receive the AC power signal from the AC bus. In some embodiments, a frequency requirement of the AC motor is different than a frequency requirement of the additional AC motor. In some embodiments, the at least one additional AC motor is a non-propulsion motor load. In some embodiments, the system includes at least one utility load configured to receive the AC power signal from the AC bus. In some embodiments, the system includes a second generator configured to generate a second AC power signal, a second AC bus configured to receive the second AC power signal from the second generator, and a second AC motor configured to receive the second AC power signal from the second AC bus without performing a full-distribution-power-rated power conversion. In some embodiments, the second AC motor is configured to rotate at a rotational frequency that is independent from a frequency of the second AC power signal. In some embodiments, the system includes a second motor control unit configured to receive the second AC power signal from the second AC bus, to perform a partial power conversion of the second AC power signal to generate a second converted power signal, and to provide the second converted power signal to the second AC motor, thereby controlling the rotational frequency of the second AC motor.

In an embodiment, an AC power distribution method includes generating, at an ISVF generator, an AC power signal having a frequency that is independent from a frequency of a prime mover. The method further includes receiving the AC power signal from the ISVF generator at an AC bus. The method also includes receiving the AC power signal at an AC load from the AC bus without performing a full-distribution-power-rated power conversion, where a frequency of the AC power signal generated by the ISVF generator meets a frequency requirement of the AC load.

In some embodiments, the method includes receiving the AC power signal from the AC bus at an additional AC load, where the additional AC load has the same frequency requirement as the AC load. In some embodiments, the method includes controlling a frequency of the AC power signal generated by the ISVF generator at a generator control unit. In some embodiments, the method includes generating, at a second ISVF generator, a second AC power signal having a frequency that is independent from a frequency of the prime mover, receiving the second AC power signal from the ISVF generator at a second AC bus, and receiving the second AC power signal at a second AC load from the second AC bus without performing a full-distribution-power-rated power conversion, where the frequency of the second AC power signal generated by the second ISVF generator meets a frequency requirement of the second AC load.

In an embodiment, an AC power distribution method includes generating, at a generator, an AC power signal. The method further includes receiving the AC power signal from the generator at an AC bus. The method also includes receiving the AC power signal at an AC motor from the AC bus without performing a full-distribution-power-rated power conversion. The method includes rotating the AC motor, using the AC power signal, at a rotational frequency that is independent from a frequency of the AC power signal.

In some embodiments, the method includes receiving the AC power signal at a motor control unit, performing a partial power conversion of the AC power signal to generate a converted power signal, and providing the converted power signal to the AC motor, thereby controlling the rotational frequency of the AC motor. In some embodiments, the method includes receiving the AC power signal from the AC bus at an additional AC motor coupled to the AC bus, and rotating the additional AC motor, using the AC power signal, at a rotational frequency that is different from the rotational frequency of the AC motor, where a frequency requirement of the AC motor is different than a frequency requirement of the additional AC motor. In some embodiments, the method includes generating, at a second generator, a second AC power signal, receiving the second AC power signal from the generator at a second AC bus, receiving the second AC power signal at a second AC motor from the second AC bus without performing a full-distribution-power-rated power conversion, and rotating the second AC motor, using the second AC power signal, at a rotational frequency that is independent from a frequency of the second AC power signal.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Figure 1:
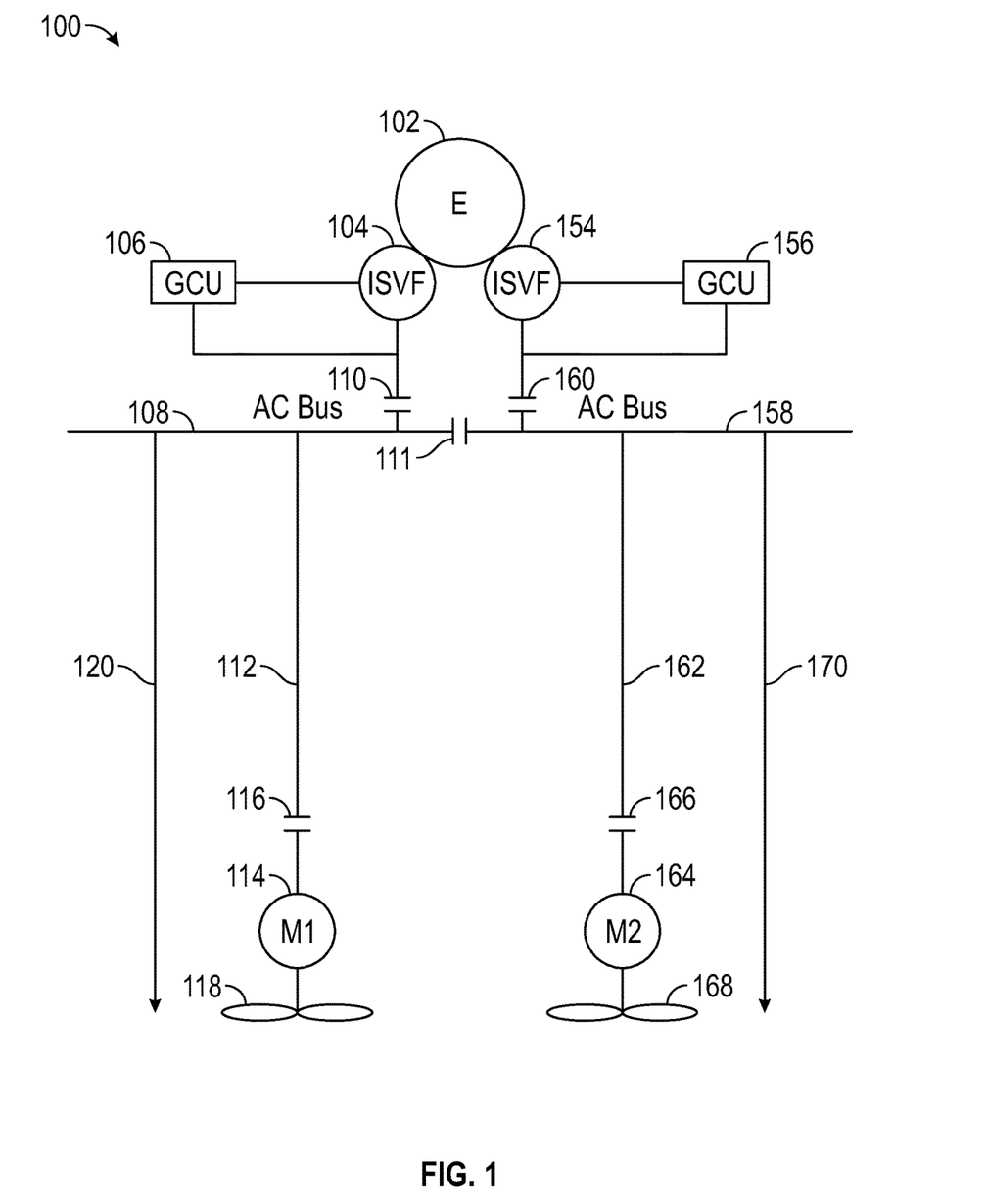
FIG. 1 is a schematic diagram depicting an embodiment of an AC power distribution system.

Referring to FIG. 1, an embodiment of an AC power distribution system 100 is depicted. The system 100 may include an engine 102. The engine 102 may be an engine of a vehicle, such as an aircraft, and may provide a primary source of power for the vehicle. For example, the engine 102 may be a jet engine, a turboprop engine, a turbine engine, an internal combustion engine, another type of mechanical engine, or combinations thereof.

The system 100 may further include a first ISVF generator 104 and a second ISVF generator 154. The first ISVF generator 104 and the second ISVF generator 154 may be coupled to the engine 102 such that the engine 102 operates as a prime mover for generating electrical power signals. For example, the first ISVF generator 104 may receive mechanical power from the engine 102 and convert the mechanical power into a first AC power signal. Likewise, the second ISVF generator 154 may receive mechanical power from the engine 102 and convert the mechanical power into a second AC power signal. Although the system 100 is depicted have including two ISVF generators, in practice, the system 100 may include more or fewer than two ISVF generators.

As used herein, an ISVF generator is an AC generator that converts mechanical rotation from a prime mover into an AC power signal with a frequency that is independent from a rotational frequency of the prime mover. ISVF generators may not be reliant on gearboxes or additional AC/DC power conversions that may be applied to the AC power signal after it has left the generator to achieve an independent frequency. An example of an ISVF generator is described in U.S. patent application Ser. No. 15/819,919, filed on Nov. 21, 2017 and entitled "Independent Speed Variable Frequency Alternating Current Generator," the contents of which are incorporated herein by reference in its entirety. Other types of ISVF generators may also be used. Because the respective frequencies of the first AC power signal generated by the first ISVF generator 104 and the second AC power signal generated by the second ISVF generator 154 are independent of a rotational frequency of the engine 102, they do not need to equal each other. Rather, in some cases, each of the ISVF generators 104, 154 may operate to generate AC power signals having independent and distinct frequencies.

In order to control the frequencies of the AC power signals, the system 100 may include a first generator control unit 106 configured to control the frequency of the AC power signal produced by the first ISVF generator 104 and a second generator control unit 156 configured to control the frequency of the AC power signal produced by the second ISVF generator 154.

The system may also include a first AC bus 108 and a second AC bus 158. The first AC bus 108 may be configured to receive the AC power signal generated by the first ISVF generator 104. Likewise, the second AC bus 158 may be configured to receive the AC power signal generated by the second ISVF generator 154.

In some embodiments, the first AC bus 108 may be coupled to an output of the first ISVF generator 104 via a first circuit breaker 110. Likewise, the second AC bus 158 may be coupled to an output of the second ISVF generator 154 via a second circuit breaker 160. A third circuit breaker 111 may couple the first AC bus 108 to the second AC bus 158. The circuit breakers 110, 111, 160 enable the system 100 to be configured in multiple states. In a first state, the circuit breakers 110, 160 are closed (enabling the AC power signals generated by the ISVF generators 104, 154 to pass to their respective AC buses 108, 158). The third circuit breaker 111 is open (separating the AC buses 108, 158). In this configuration, each of the AC buses 108, 158 may receive different AC power signals having different frequencies. In a second state, the circuit breakers 110, 111 may be closed while the second circuit breaker 160 is open. In this configuration, the first ISVF generator 104 may drive both the first AC bus 108 and the second AC bus 158. As such, each of the AC buses 108, 158 may carry the same AC power signal with the same frequency. In a third state, the circuit breakers 111, 160 may be closed while the first circuit breaker 110 is open. In this configuration, the second ISVF generator 154 may drive both the first AC bus 108 and the second AC bus 158. In a fourth state, the each of the circuit breakers 110, 111, 160 may be closed. In this configuration, the ISVF generators 104, 154 may be coordinated in order to drive both of the AC buses 108, 158 at the same frequency. This state may be used to enable one of the ISVF generators 104, 154 to supplement an AC power signal from the other.

The system 100 may include at least one first power distribution line 112 to provide power from the first AC bus 108 to a first AC motor 114 via a fourth circuit breaker 116. The first AC motor 114 may provide mechanical power to a first propulsion system 118 such as a propeller, or other thrust generating device. The system 100 may also include at least one second power distribution line 162 to provide power from the second AC bus 158 to a second AC motor 164 via a fifth circuit breaker 166. The second AC motor 164 may power a second propulsion system 168. Additional distribution lines 120, 170 may provide AC power from the AC buses 108, 158 to other AC loads, such as additional AC motors or utility loads. Any additional AC motors coupled to the additional distribution lines 120, 170 may have the same frequency requirements as the AC motors 114, 164.

Notably, the system 100 is capable of functioning without performing a full-distribution-power-rated power conversion after the AC power signals are generated by the ISVF generators 104, 154. In particular, the AC motors 114, 164 may receive AC power signals directly from their respective buses 108, 158 without such full-distribution-power-rated power conversions.

As used herein, a full-distribution-power-rated power conversion is a conversion of an AC power signal to a DC power signal, or a conversion of a DC power signal to an AC power signal, where substantially all of the electrical energy being distributed within the power signal (e.g., all the electrical energy generated by a generator or all the electrical energy required by a particular load) is converted. For example, full-distribution-power-rated power conversion typically relies on an intervening rectifier, inverter, motor controller, or other type of power converter, positioned between a power distribution bus and a load. In contrast, as depicted in FIG. 1, the first AC motor 114 may be coupled directly to the first AC bus 108 without having an intervening rectifier, inverter, motor controller, or other type of power converter, positioned therebetween.

In order to meet a frequency requirement of the AC motors 114, 164, the generator control units 106, 156 may adjust a frequency of the AC power signals generated by the ISVF generators 104, 154. As such, the frequency of the AC power signals present on the AC buses 108, 158 may be used to drive the AC motors 114, 164 directly. This may eliminate any need for further conversion of the AC power signals on the AC buses 108, 158.

During operation, the ISVF generators 104, 154 may generate AC power signals having frequencies that are independent from a frequency of the engine 102 and that meet frequency requirements of the AC motors 114, 164. The AC power signals may be received at their respective AC buses 108, 158. From the AC buses 108, 158, the power signals may be received at the AC motors 114, 164 without performing a full-distribution-power-rated power conversion.

A benefit of the system 100 is that by using ISVF generators to match the frequency of the AC power signal on the AC buses 108, 158 to frequency requirements of the AC motors 114, 164, additional conversion elements, such as full-distribution-power-rated rectifiers and inverters may be omitted from the distribution architecture. This may result in more efficient power distribution and a lighter weight. When incorporated into an aircraft vehicle, the system 100 may lower costs associated with the production, maintenance, and operation of the aircraft. Further, the system 100 is simplified as compared to typical aircraft vehicle power distribution systems and may, therefore, result in an increased lifespan. Other advantages may exist.

Figure 2:
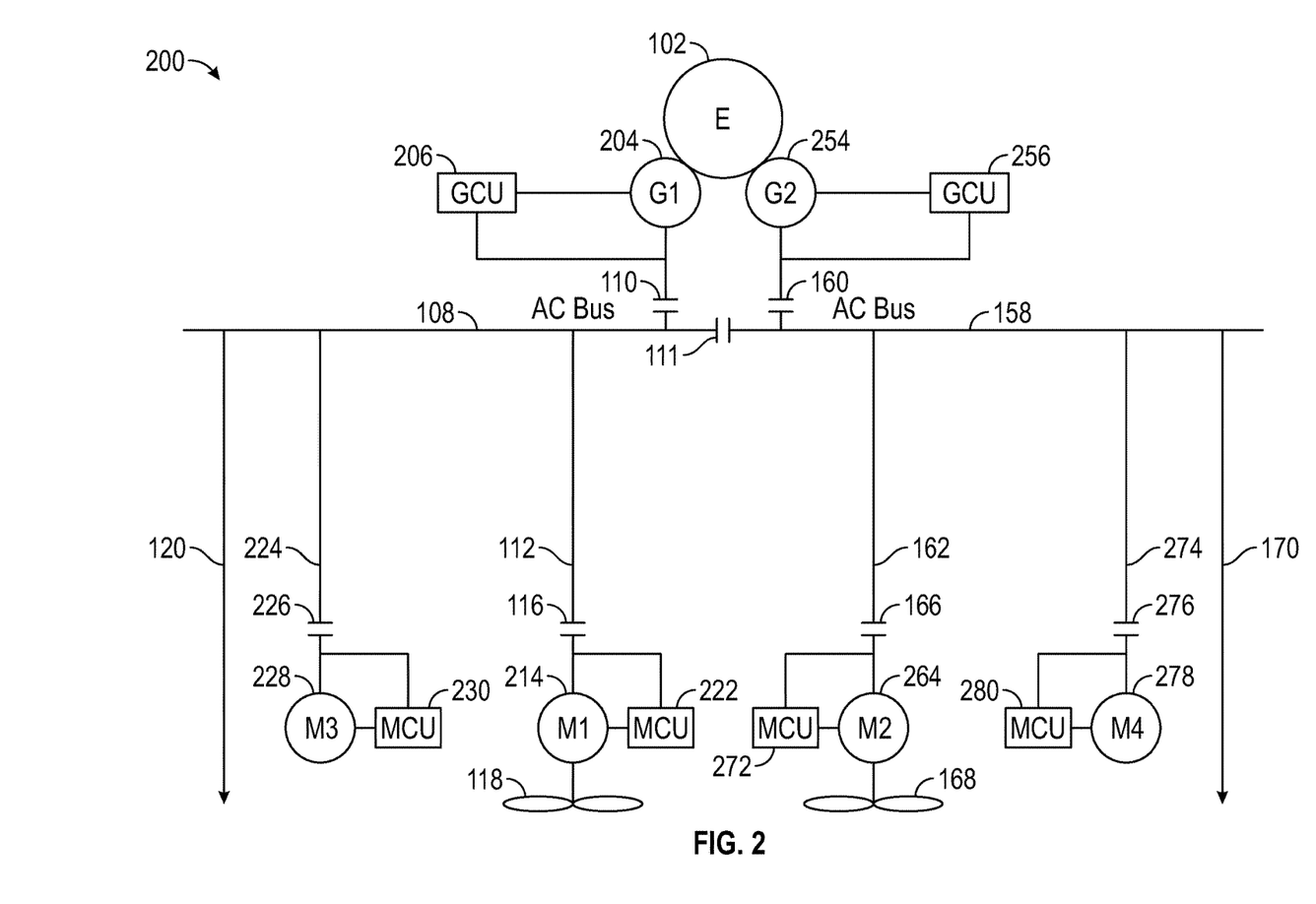
FIG. 2 is a schematic diagram depicting an embodiment of an AC power distribution system.

Referring to FIG. 2, an embodiment of an AC power distribution system 200 is depicted. The system 200 may include an engine 102, circuit breakers 110, 111, 116, 160, 166, a first AC bus 108, a second AC bus 158, power distribution lines 112, 120, 162, 170, and propulsion systems 118, 168, similar to the system 100.

The system 200 may further includes a first generator 204 and a second generator 254. The generators 204, 254 may include ISVF generators as described with reference to FIG. 1 or other types of generators, such as variable speed variable frequency (VSVF) generators, constant speed constant frequency (CSCF) generators, or the like. The first generator 204 and the second generator 254 may be coupled to the engine 102 such that the engine 102 operates as a prime mover for generating electrical power signals. For example, the first generator 204 may receive mechanical power from the engine 102 and convert the mechanical power into a first AC power signal. Likewise, the second generator 254 may receive mechanical power from the engine 102 and convert the mechanical power into a second AC power signal. Although the system 200 is depicted have including two generators, in practice, the system 200 may include more or fewer than two generators.

The system 200 may include a first generator control unit 206 and a second generator control unit 256. In embodiments where the generators 204, 254 include ISVF generators, the generator control units 206, 256 may control the frequencies of the AC power signals produced by the generators 204, 254. In other embodiments, the frequencies of the AC power signals may be dependent on a rotational frequency of the engine 102, or other factors, and the generator control units 206, 256 may control other aspects of power generation at the generators 204, 254. In some embodiments, the generator control units 206, 256 may be omitted.

The AC power signals generated by the first generator 204 and the second generator 254 may be transmitted to the first AC bus 108 and the second AC bus 158, respectively. The circuit breakers 110, 111, 160 may enable the system 200 to be operated in different states, providing the same configurations of power distribution on the AC buses 108, 158 as described with reference to the system 100 of FIG. 1.

The system 200 may include a first variable speed independent frequency (VSIF) motor 214 and a second VSIF motor 264. The first VSIF motor 214 may receive the first AC power signal from the first AC bus 108 and the second VSIF motor 264 may receive the second AC power signal from the second AC bus 158.

As used herein, a VSIF motor is an AC motor that converts an AC power signal into mechanical rotation with a rotational frequency that is independent from a frequency of the AC power signal. VSIF motors are not reliant on gearboxes or additional AC/DC power conversions that may be applied to the AC power signal before it powers the motor to achieve an independent rotational frequency. Rather, a VSIF motor may use multiple phases of windings on a stator and on a rotor. At least one phase on the stator may generate a rotating magnetic field configured to rotate a rotor while at least another phase on the rotor generates a second rotating magnetic field that either increases or decreases a rotational frequency of the rotor relative to the rotational frequency of the rotating magnetic field produced by the first phase. In a typical VSIF motor, three or more windings may be used to separate the rotational frequency of the rotor from the frequency of the AC signal driving the motor.

In order to control the rotational frequencies of the VSIF motors 214, 264, the system 200 may include a first motor control unit 222 configured to control the rotational frequency of the first VSIF motor 214 and a second motor control unit 272 configured to control the rotational frequency of the second VSIF motor 264.

As used herein, a motor control unit differs from a motor controller used in typical vehicle electrical systems. In particular, motor controllers used in typical vehicle electrical systems rely on full-distribution-power-rated power conversions in order to drive their respective motors. In contrast, motor control units, as used herein, may perform only a partial power conversion sufficient to generate a rotating magnetic field at a set of windings attached to a rotor of a VSIF motor, while the majority of the power within an AC power signal is passed directly to the VSIF motor without any conversion. The VSIF motors 214, 264 may be used to drive the propulsion systems 118, 168.

The system 200 may further include non-propulsion AC motor loads. For example, the system 200 may include a third distribution line 224 that provides the first AC power signal from the first AC bus 108 to a third VSIF motor 228 via a sixth circuit breaker 226. The third VSIF motor 228 may be controlled by a third motor control unit 230. The system 200 may also include a fourth distribution line 274 that provides the second AC power signal from the second AC bus 158 to a fourth VSIF motor 278 via a seventh circuit breaker 276. The fourth VSIF motor 278 may be controlled by a fourth motor control unit 280. The third VSIF motor 228 and the fourth VSIF motor 278 may be used as part of non-propulsion systems such as ventilation systems, electrical actuation systems, other motorized systems, or combinations thereof.

During operation, the generators 204, 254 may generate AC power signals and transmit the AC power signals to their respective AC buses 108, 158. Frequencies of the AC power signals may fall outside rotational frequency requirements of the propulsion systems 118, 168, or requirements of other motorized systems powered by the system 200. From the AC buses 108, 158, the power signals may be received at the VSIF motors 214, 264 without performing a full-distribution-power-rated power conversion. The motor control units 222, 272 may control the VSIF motors 214, 264 to operate at frequencies that are independent of their respective AC power signals. In that way, rotational frequencies of the VSIF motors 214, 264 may fall within the requirements of the propulsion systems 118, 168 independent of the frequencies of the AC power signals. Likewise, the VSIF motors 228, 278 associated with non-propulsion related loads may be operated at rotational frequencies that are independent of the frequencies of the AC power signals.

A benefit of the system 200 is that by using VSIF motors to drive the propulsion systems 118, 168, the propulsion systems 118, 168 may operate within their respective frequency requirements. Further, as with the system 100, additional conversion elements, such as full-distribution-power-rated rectifiers and inverters may be omitted from the distribution architecture. This may result in more efficient power distribution and lighter weight. When incorporated into an aircraft vehicle, the system 200 may lower costs associated with the production, maintenance, and operation of the aircraft. Further, the system 200 is simplified as compared to typical aircraft vehicle power distribution systems and may, therefore, have an increased lifespan. Other advantages may exist.

Figure 3:
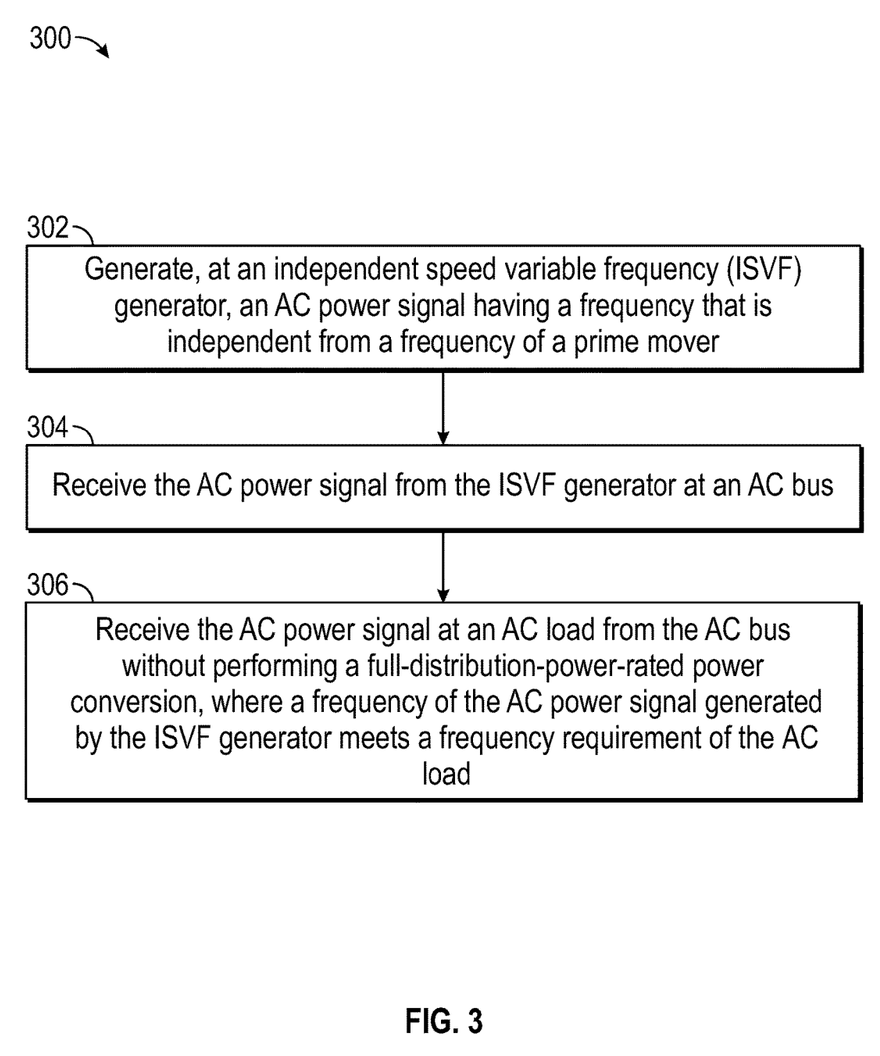
FIG. 3 is a flow diagram depicting an embodiment of an AC power distribution method.

Referring to FIG. 3, an embodiment of an AC power distribution method 300 is depicted. The method 300 may include generating, at an ISVF generator, an AC power signal having a frequency that is independent from a frequency of a prime mover, at 302. For example, the first ISVF generator 104 may generate an AC power signal that is independent of a rotational frequency of the engine 102.

The method 300 may further include receiving the AC power signal from the ISVF generator at an AC bus, at 304. For example, the AC power signal may be received at the first AC bus 108.

The method 300 may also include receiving the AC power signal at an AC load from the AC bus without performing a full-distribution-power-rated power conversion, where a frequency of the AC power signal generated by the ISVF generator meets a frequency requirement of the AC load, at 306. For example, the AC power signal may be received at the first AC motor 114. As depicted in FIG. 1, the AC power signal may transmitted directly to the first AC motor 114 without passing through any conversion circuits.

A benefit of the method 300 is that by using ISVF generators to match the frequency of the AC power signal on the AC buses to frequency requirements of the AC load, additional conversion elements, such as full-distribution-power-rated rectifiers and inverters may be omitted from the distribution architecture. When incorporated into an aircraft vehicle, the method 300 may lower costs associated with the production, maintenance, and operation of the aircraft. Further, the method 300 is simplified as compared to typical aircraft vehicle power distribution methods and may, therefore, enable an increased lifespan of the aircraft vehicle. Other advantages may exist.

Figure 4:
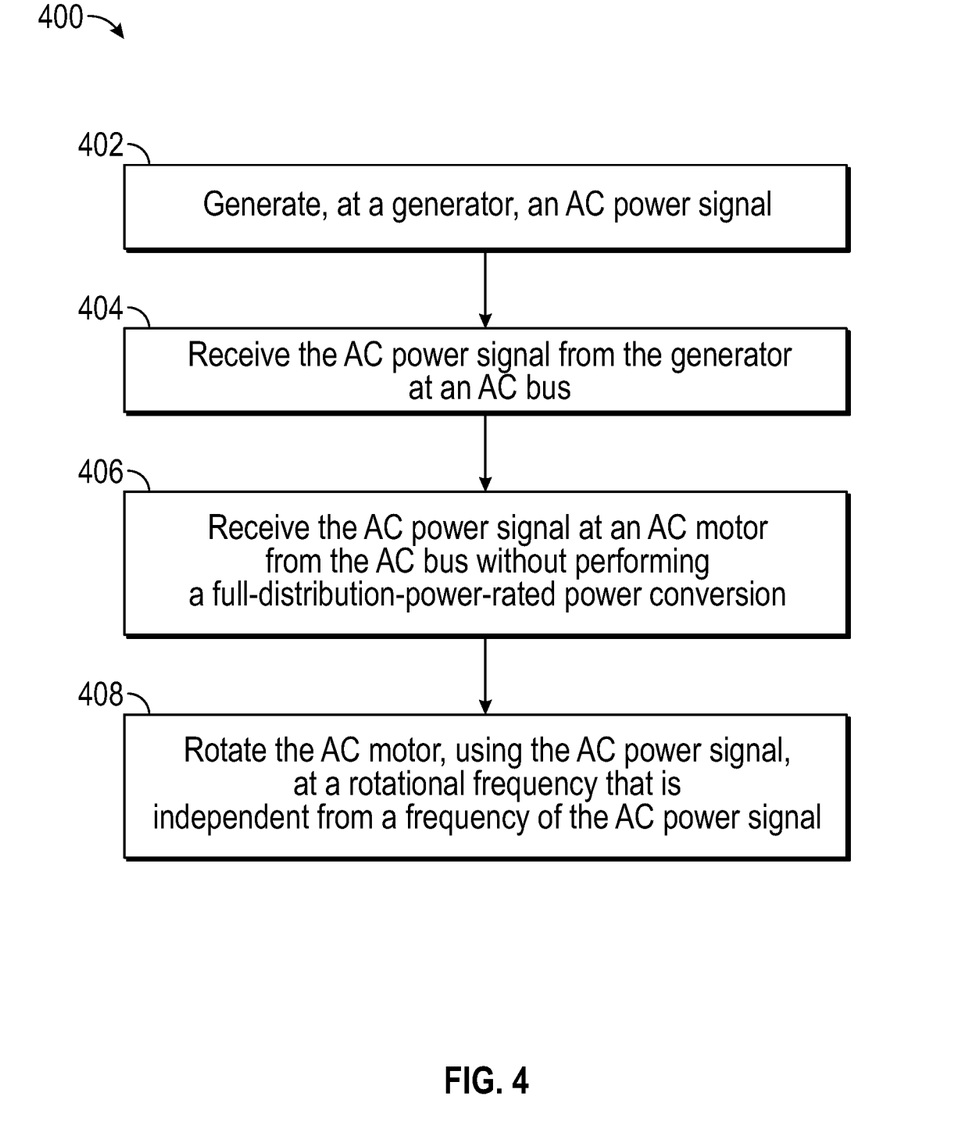
FIG. 4 is a flow diagram depicting an embodiment of an AC power distribution method.

Referring to FIG. 4, an embodiment of an AC power distribution method 400 is depicted. The method 400 may include generating, at a generator, an AC power signal, at 402. For example, the generator 204 may generate an AC power signal.

The method 400 may further include receiving the AC power signal from the generator at an AC bus, at 404. For example, the AC power signal may be received at the AC bus 108.

The method 400 may also include receiving the AC power signal at an AC motor from the AC bus without performing a full-distribution-power-rated power conversion, at 406. For example, the AC power signal may be received directly at the AC motor 214 without any intervening rectifier, inverter, motor controller, or other type of power converter performing a full-distribution-power-rated power conversion.

The method 400 may include rotating the AC motor, using the AC power signal, at a rotational frequency that is independent from a frequency of the AC power signal, at 408. For example, the AC motor 214 may be controlled by the motor control unit 222 to operate at a frequency that is independent from the frequency of the AC power signal.

Figure 5:
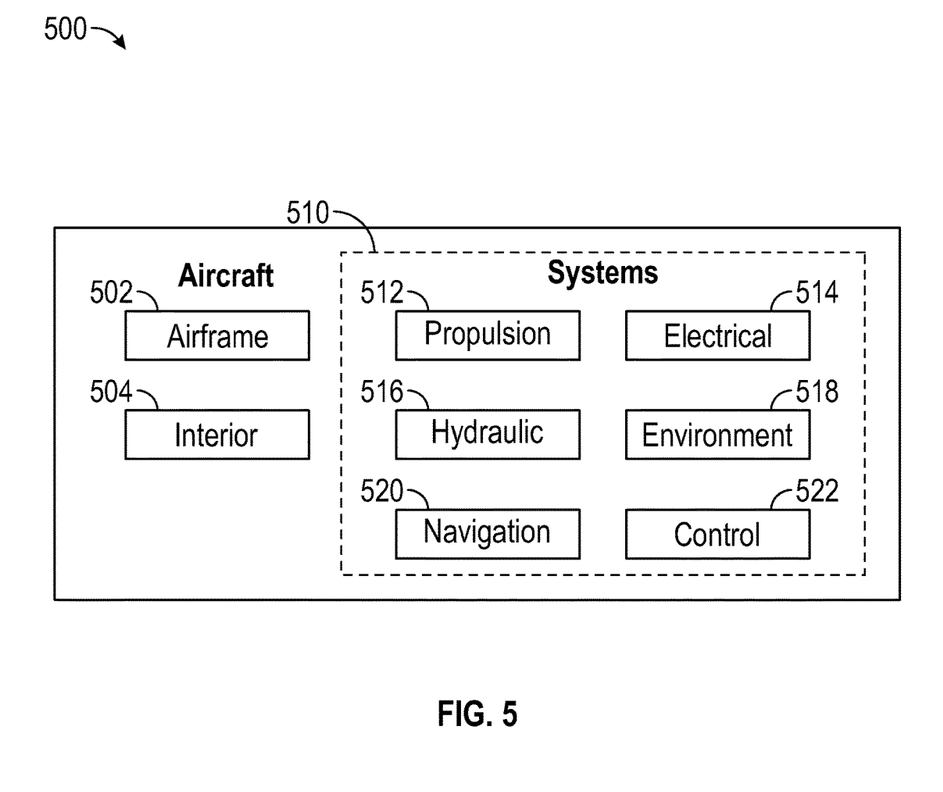
FIG. 5 is a block diagram depicting an embodiment of an aircraft including an AC power distribution system.

Referring to FIG. 5, an embodiment of an aircraft 500 is depicted. The aircraft 500 may include an airframe 502, an interior 504, and a plurality of systems 510. Examples of high-level systems 510 include one or more of a propulsion system 512, an electrical system 514, a hydraulic system 516, an environmental system 518, a navigation system 520, and a control system 522. Any number of other systems may be included. Although an aerospace example is shown, the principles of the disclosure may be applied to other industries, such as the automotive industry.

As described herein, the systems 100, 200 may be incorporated into the aircraft 500. For example, the electrical system 514 may include the ISVF generators 104, 154, the generator control units 106, 156, the AC buses 108, 158, and/or the AC motors 114, 164 of FIG. 1. The electrical system 514 may, alternatively or additionally, include the generators 204, 254, the generator control units 206, 256, the VSIF motors 214, 228, 264, 278, and/or the motor control units 222, 230, 272, 280 of FIG. 2.

Although various embodiments have been shown and described, the present disclosure is not so limited and will be understood to include all such modifications and variations as would be apparent to one skilled in the art.

What is claimed is:

1. An alternating current (AC) power distribution system comprising:
   an independent speed variable frequency (ISVF) generator configured to generate an AC power signal having a frequency that is independent from a frequency of a prime mover;
   an AC bus configured to receive the AC power signal from the ISVF generator; and
   at least one AC load configured to receive the AC power signal from the AC bus without performing a full-distribution-power-rated power conversion, wherein the frequency of the AC power signal generated by the ISVF generator meets a frequency requirement of the AC load.

2. The system of claim 1, wherein the AC load is an AC motor and wherein the frequency requirement of the AC load corresponds to a rotational frequency requirement of the AC motor.

3. The system of claim 2, wherein the AC motor is incorporated into an aircraft propulsion system.

4. The system of claim 1, further comprising:
   a generator control unit configured to control a frequency of the AC power signal generated by the ISVF generator to meet the frequency requirement of the AC load.

5. The system of claim 1, further comprising:
   at least one additional AC load configured to receive the AC power signal from the AC bus.

6. The system of claim 5, wherein the at least one additional AC load has the same frequency requirement as the AC load.

7. The system of claim 1, further comprising:
   a second ISVF generator configured to generate a second AC power signal having a frequency that is independent from a frequency of the prime mover;
   a second AC bus configured to receive the second AC power signal from the second ISVF generator; and
   a second AC load configured to receive the second AC power signal from the second AC bus without performing a full-distribution-power-rated power conversion, wherein the frequency of the second AC power signal generated by the second ISVF generator meets a frequency requirement of the second AC load.

8. The system of claim 1, wherein the prime mover is a vehicle engine.

9. An alternating current (AC) power distribution system comprising:
   a generator configured to generate an AC power signal;
   an AC bus configured to receive the AC power signal from the generator;
   an AC motor configured to receive the AC power signal from the AC bus without performing a full-distribution-power-rated power conversion, wherein the AC motor is configured to rotate at a rotational frequency that is independent from a frequency of the AC power signal; and
   a motor control unit configured to receive the AC power signal from the AC bus, to perform a partial power conversion of the AC power signal to generate a converted power signal, and to provide the converted power signal to the AC motor, thereby controlling the rotational frequency of the AC motor.

10. The system of claim 9, wherein the AC motor is incorporated into an aircraft propulsion system.

11. The system of claim 9, wherein the generator is an independent speed variable frequency (ISVF) generator, a variable speed variable frequency (VSVF) generator, or a constant speed constant frequency (CSCF) generator.

12. The system of claim 9, further comprising at least one additional AC motor configured to receive the AC power signal from the AC bus.

13. The system of claim 12, wherein a frequency requirement of the AC motor is different than a frequency requirement of the additional AC motor.

14. The system of claim 12, wherein the at least one additional AC motor is a non-propulsion motor load.

15. The system of claim 9, further comprising:
   at least one utility load configured to receive the AC power signal from the AC bus.

16. The system of claim 9, further comprising:
   a second generator configured to generate a second AC power signal;
   a second AC bus configured to receive the second AC power signal from the second generator;
   a second AC motor configured to receive the second AC power signal from the second AC bus without performing a full-distribution-power-rated power conversion, wherein the second AC motor is configured to rotate at a rotational frequency that is independent from a frequency of the second AC power signal; and
   a second motor control unit configured to receive the second AC power signal from the second AC bus, to perform a partial power conversion of the second AC power signal to generate a second converted power signal, and to provide the second converted power signal to the second AC motor, thereby controlling the rotational frequency of the second AC motor.

17. An alternating current (AC) power distribution method comprising:

generating, at an independent speed variable frequency (ISVF) generator, an AC power signal having a frequency that is independent from a frequency of a prime mover;
receiving the AC power signal from the ISVF generator at an AC bus; and
receiving the AC power signal at an AC load from the AC bus without performing a full-distribution-power-rated power conversion, wherein a frequency of the AC power signal generated by the ISVF generator meets a frequency requirement of the AC load.

18. The method of claim 17, further comprising:
receiving the AC power signal from the AC bus at an additional AC load, wherein the additional AC load has the same frequency requirement as the AC load.

19. The method of claim 17, further comprising:
controlling a frequency of the AC power signal generated by the ISVF generator at a generator control unit.

20. The method of claim 17, further comprising:
generating, at a second ISVF generator, a second AC power signal having a frequency that is independent from a frequency of the prime mover;
receiving the second AC power signal from the second ISVF generator at a second AC bus; and
receiving the second AC power signal at a second AC load from the second AC bus without performing a full-distribution-power-rated power conversion, wherein the frequency of the second AC power signal generated by the second ISVF generator meets a frequency requirement of the second AC load.

21. An alternating current (AC) power distribution method comprising:
generating, at a generator, an AC power signal;
receiving the AC power signal from the generator at an AC bus;
receiving the AC power signal at an AC motor from the AC bus without performing a full-distribution-power-rated power conversion; and
rotating the AC motor, using the AC power signal, at a rotational frequency that is independent from a frequency of the AC power signal.

22. The method of claim 21, further comprising:
receiving the AC power signal at a motor control unit;
performing a partial power conversion of the AC power signal to generate a converted power signal; and
providing the converted power signal to the AC motor, thereby controlling the rotational frequency of the AC motor.

23. The method of claim 21, further comprising:
receiving the AC power signal from the AC bus at an additional AC motor coupled to the AC bus; and
rotating the additional AC motor, using the AC power signal, at a rotational frequency that is different from the rotational frequency of the AC motor, wherein a frequency requirement of the AC motor is different than a frequency requirement of the additional AC motor.

24. The method of claim 21, further comprising:
generating, at a second generator, a second AC power signal;
receiving the second AC power signal from the generator at a second AC bus;
receiving the second AC power signal at a second AC motor from the second AC bus without performing a full-distribution-power-rated power conversion; and
rotating the second AC motor, using the second AC power signal, at a rotational frequency that is independent from a frequency of the second AC power signal.

* * * * *